(12) United States Patent
Lee et al.

(10) Patent No.: US 11,048,170 B2
(45) Date of Patent: *Jun. 29, 2021

(54) APPARATUS FOR DISPENSING LIQUID MATERIAL AND METHOD FOR FABRICATING SEMICONDUCTOR DEVICE

(71) Applicant: TAIWAN SEMICONDUCTOR MANUFACTURING COMPANY LTD., Hsinchu (TW)

(72) Inventors: Yung-Yao Lee, Hsinchu County (TW); Chen Yi Hsu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/908,557

(22) Filed: Jun. 22, 2020

(65) Prior Publication Data
US 2020/0326626 A1    Oct. 15, 2020

Related U.S. Application Data

(63) Continuation of application No. 16/439,274, filed on Jun. 12, 2019, now Pat. No. 10,691,020.

(60) Provisional application No. 62/750,561, filed on Oct. 25, 2018.

(51) Int. Cl.
| | | |
|---|---|---|
| G03B 27/32 | (2006.01) |
| G03F 7/30 | (2006.01) |
| G03F 7/16 | (2006.01) |
| H01L 21/027 | (2006.01) |
| G03F 7/32 | (2006.01) |
| G03F 7/20 | (2006.01) |

(52) U.S. Cl.
CPC ............ *G03F 7/3021* (2013.01); *G03F 7/162* (2013.01); *G03F 7/20* (2013.01); *G03F 7/322* (2013.01); *G03F 7/325* (2013.01); *G03F 7/327* (2013.01); *H01L 21/0274* (2013.01)

(58) Field of Classification Search
CPC .......... G03F 7/162; G03F 7/20; G03F 7/3021; G03F 7/322; G03F 7/325; G03F 7/327; H01L 21/0274; H01L 21/6715
See application file for complete search history.

(56) References Cited

U.S. PATENT DOCUMENTS 10,691,020 B2 *  6/2020  Lee ...................... G03F 7/322
2001/0047753 A1 * 12/2001  Nagamine ......... H01L 21/67051
                                                      118/666

* cited by examiner

*Primary Examiner* — Peter B Kim
(74) *Attorney, Agent, or Firm* — WPAT, P.C., Intellectual Property Attorneys; Anthony King

(57) ABSTRACT

The present disclosure provides an apparatus for dispensing liquid material, including a dispensing arm, a wafer holder against the dispensing arm, a first nozzle on the dispensing arm, a first distance laterally spacing the first nozzle and a center of the wafer holder, and a first height vertically spacing the first nozzle and a surface of the wafer holder, and a second nozzle on the dispensing arm, a second distance laterally spacing the second nozzle and the center of the wafer holder, and a second height vertically spacing the second nozzle and the surface of the wafer holder, wherein the second distance is greater than the first distance, and the first height is greater than the second height.

20 Claims, 17 Drawing Sheets

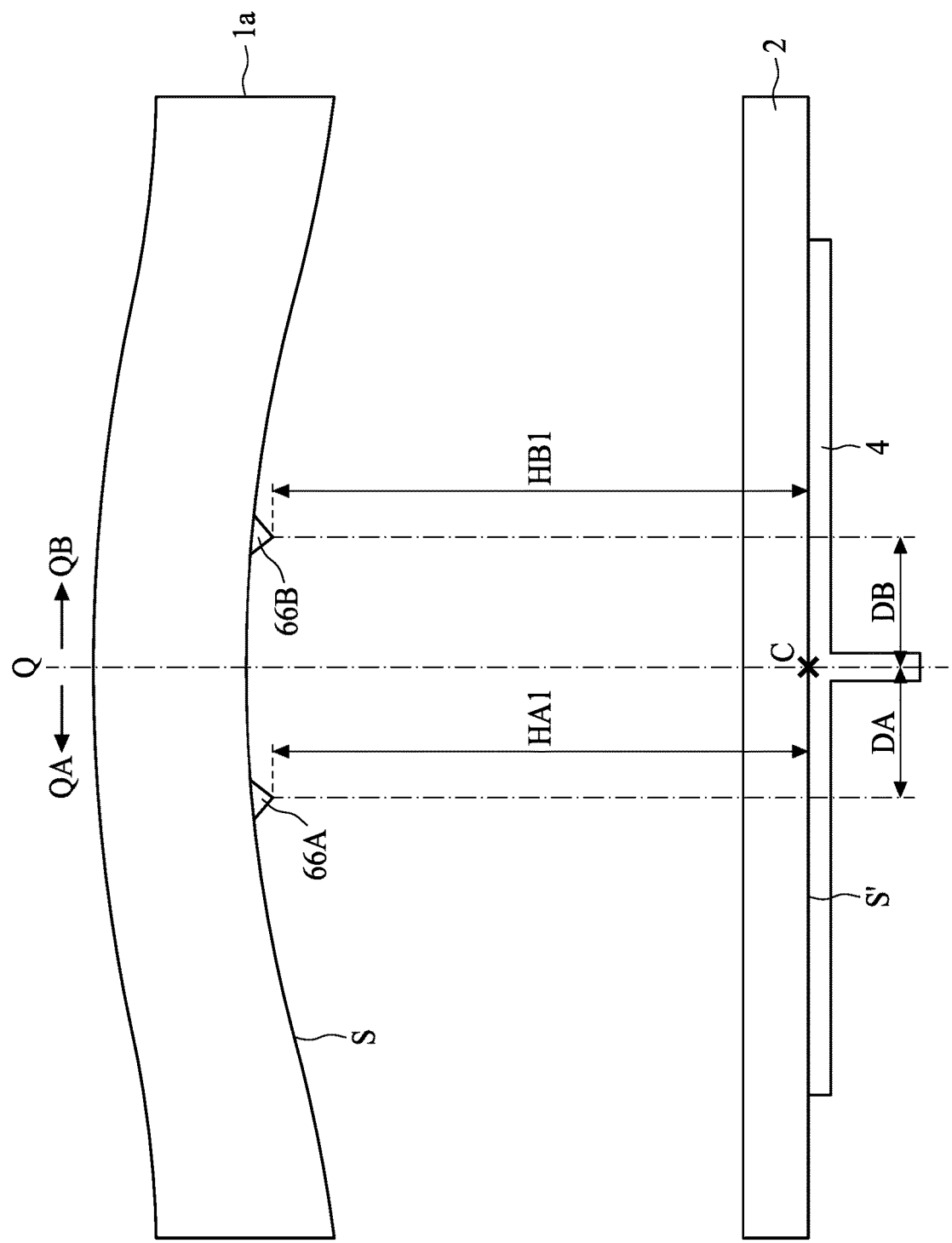

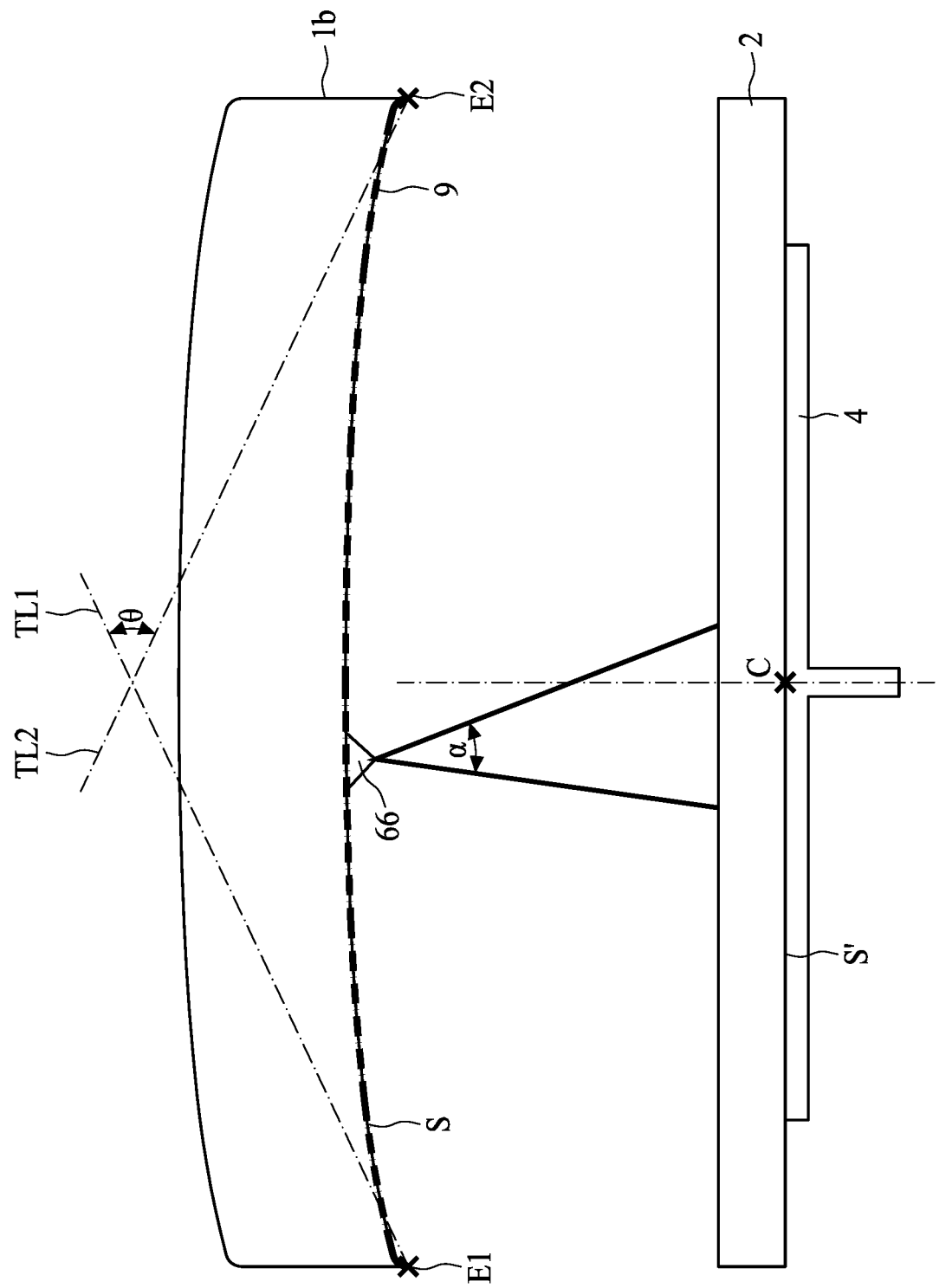

APPARATUS FOR DISPENSING LIQUID MATERIAL AND METHOD FOR FABRICATING SEMICONDUCTOR DEVICE

CROSS REFERENCE TO RELATED APPLICATIONS

This application is a continuation application of U.S. application Ser. No. 16/439,274, filed Jun. 12, 2019, and claims the benefit thereof under 35 U.S.C. 120, which claims the benefit of prior-filed provisional application No. 62/750,561, filed Oct. 25, 2018.

BACKGROUND

In the semiconductor industry, there is a trend toward higher device density. In order to achieve such higher density, smaller features are required. Such requirements frequently involve scaling down device geometries to achieve lower fabrication costs, higher device integration density, higher speeds, and better performance. Along with the advantages from geometry size reductions, improvements to semiconductor devices are being made.

The scaling down process entails high resolution photolithographic process. Photolithography process may include techniques pertinent to coating a photoresist layer on a wafer and exposing the wafer to an exposing source. Subsequent to operations of coating and exposing, developer material is applied on the photoresist layer and the wafer is spun to disperse the developer material over the wafer. Thus at least a portion of the photoresist layer, which can be an irradiated portion or a non-irradiated portion, is dissolved by e developer material and thereby removed in order to form a predetermined pattern.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A is a cross sectional view showing an apparatus for dispensing liquid material, in accordance with some embodiments of the present disclosure.

FIG. 6A to FIG. 6C are cross sectional views showing an apparatus for dispensing liquid material, in accordance with some embodiments of the present disclosure.

DETAILED DESCRIPTION

Figure 1:
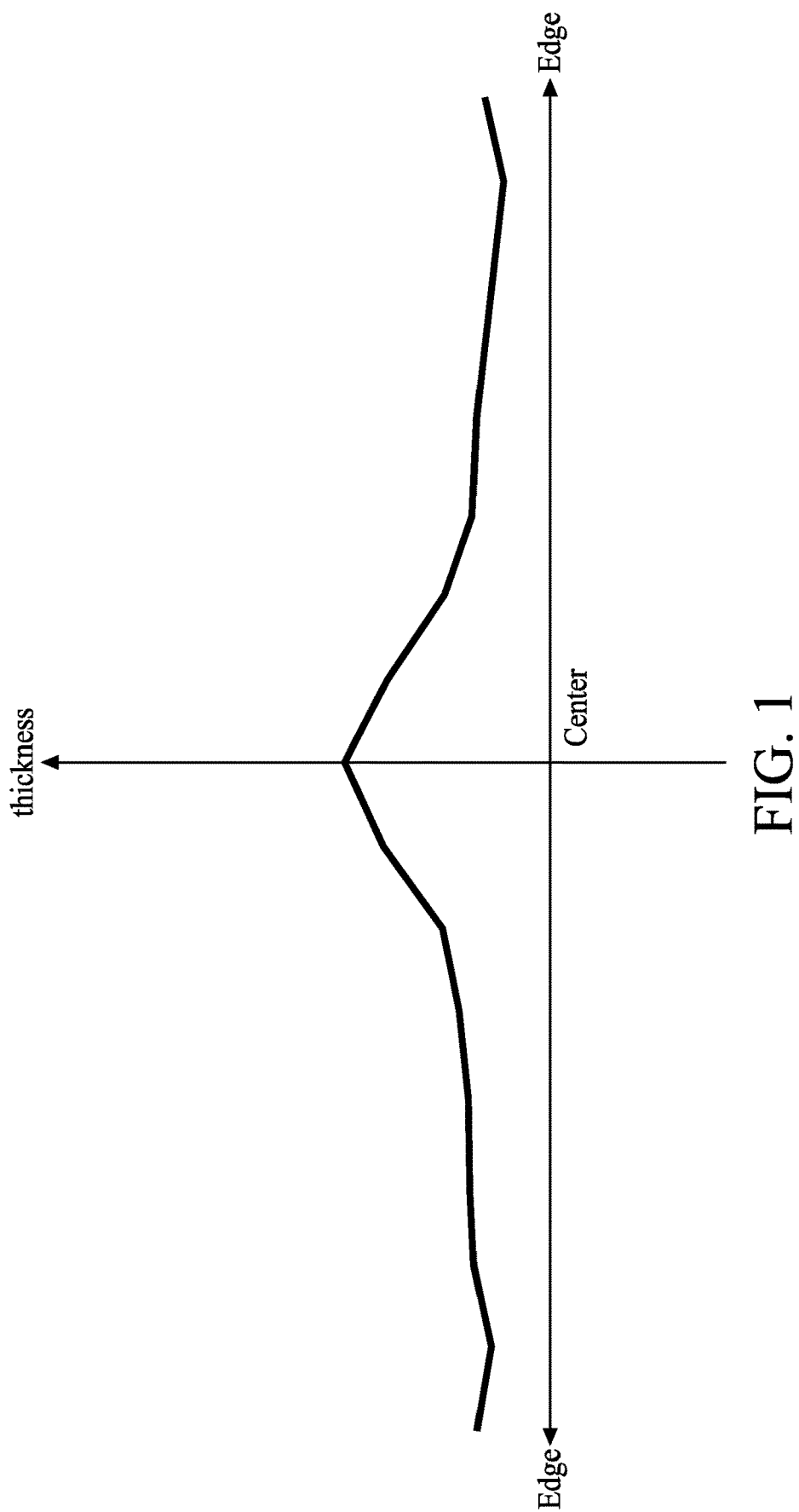
FIG. 1 shows a thickness profile of a photoresist layer formed on a wafer, according to some embodiments of present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Spin coating is used in the operations for fabricating semiconductor devices, which utilizes centripetal acceleration to disperse a liquid material radially outward from a center of a wafer toward an edge of the wafer. However, some of the fabrication operations may entail liquid material with higher viscosity, for example, photoresist material having a viscosity greater than 100 millipascal-second such as polyimide. Due to high viscosity, the liquid or photoresist is difficult to be uniformly spread out, thus a thickness profile of the dispersed liquid may be non-uniform. Referring to FIG. 1, FIG. 1 shows a thickness profile of a photoresist layer 3 (shown in FIG. 4) formed on a wafer 2 (shown in FIG. 4), according to some embodiments of present disclosure. Horizontal axis represents locations on a wafer 2 and vertical axis represents a thickness profile of the photoresist layer 3. A thickness of the photoresist layer 3 around a center of the wafer may be greater than a thickness of the photoresist layer 3 proximal to an edge of the wafer. If a developing solution is uniformly applied by a plurality of coplanar nozzles to a top surface of the aforesaid photoresist layer 3 having a non-uniform thickness profile, thicker portion of the photoresist layer 3, whose exposed patterns should be completely removed, may remain some photoresist residue around the thicker portion of the photoresist layer 3.

More precise control of photolithography operations are entailed due to the small features of semiconductor devices. Such non-uniform thickness profile of the photoresist layer 3 may deteriorate the performance of subsequent operations, such as photolithographic operations, etching operations, deposition operations, or the like, and thence degrade the yield rate of the fabricated devices. Therefore an apparatus as well as a method adapted for non-uniform photoresist layer developing is required.

Figure 2A:
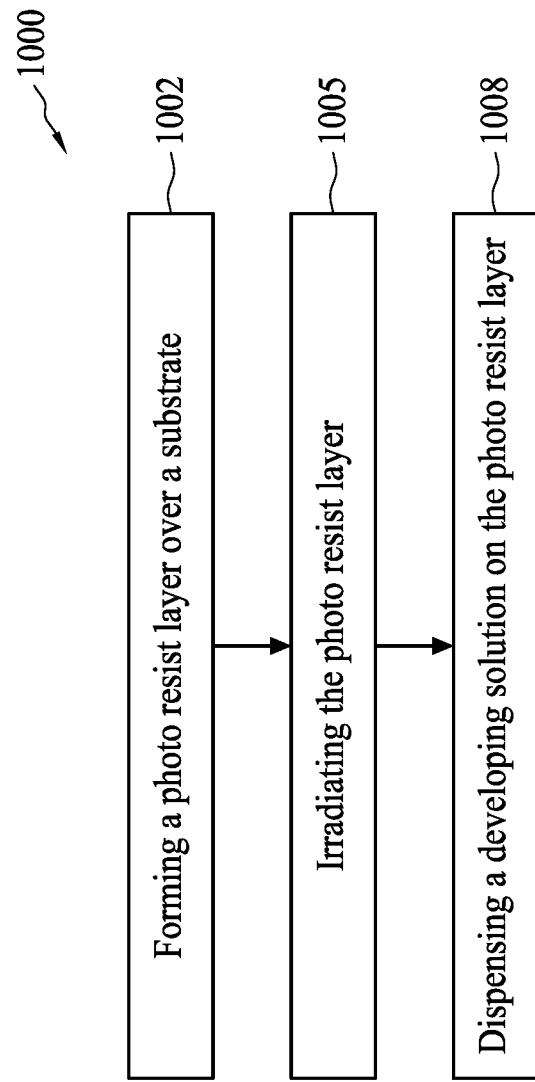
FIG. 2A shows manufacturing operations of a method for fabricating a semiconductor structure, in accordance with some embodiments of the present disclosure.

Referring to FIG. 2A, FIG. 2A shows manufacturing operations of a method for fabricating a semiconductor structure, in accordance with some embodiments of the present disclosure. The method 1000 for fabricating a semiconductor structure includes forming a photoresist layer over a substrate (operation 1002), irradiating the photoresist layer (operation 1005), and dispensing a developing solution on the photoresist layer (operation 1008) by an apparatus provided by the present disclosure, which will be discussed in FIG. 3 to FIG. 7B subsequently. As previously discussed in FIG. 1, a photoresist material applied on a top surface of the wafer in operation 1002 can be positive photoresist or negative photoresist. In some embodiments, the photoresist material may have a viscosity greater than 100 millipascal-second (mPa*s). For example, polyimide (PI) has a viscosity in a range of from about 1400 to 1600 (mPa*s). In operation 1005, the exposing source utilized to irradiate the photoresist layer 3 (shown in FIG. 4) may be optical light, x-ray, outer ray, electron beam, Gaussian beam, variable shaped beam, ultra violet beam, extreme ultra violet (EUV) beam, excimer laser, laser, or the like. In operation 1008, developing solution may include positive developer (PTD) or negative developer (NTD), such as tetramethylammonium hydroxide (TMAH) solution, dimethylbenzene ($C_8H_{10}$) solution, potassium hydroxide (KOH) solution, sodium hydroxide (NaOH) solution, metal ion free (MIF) developer, organic developer, inorganic developer, or the like.

Figure 2B:
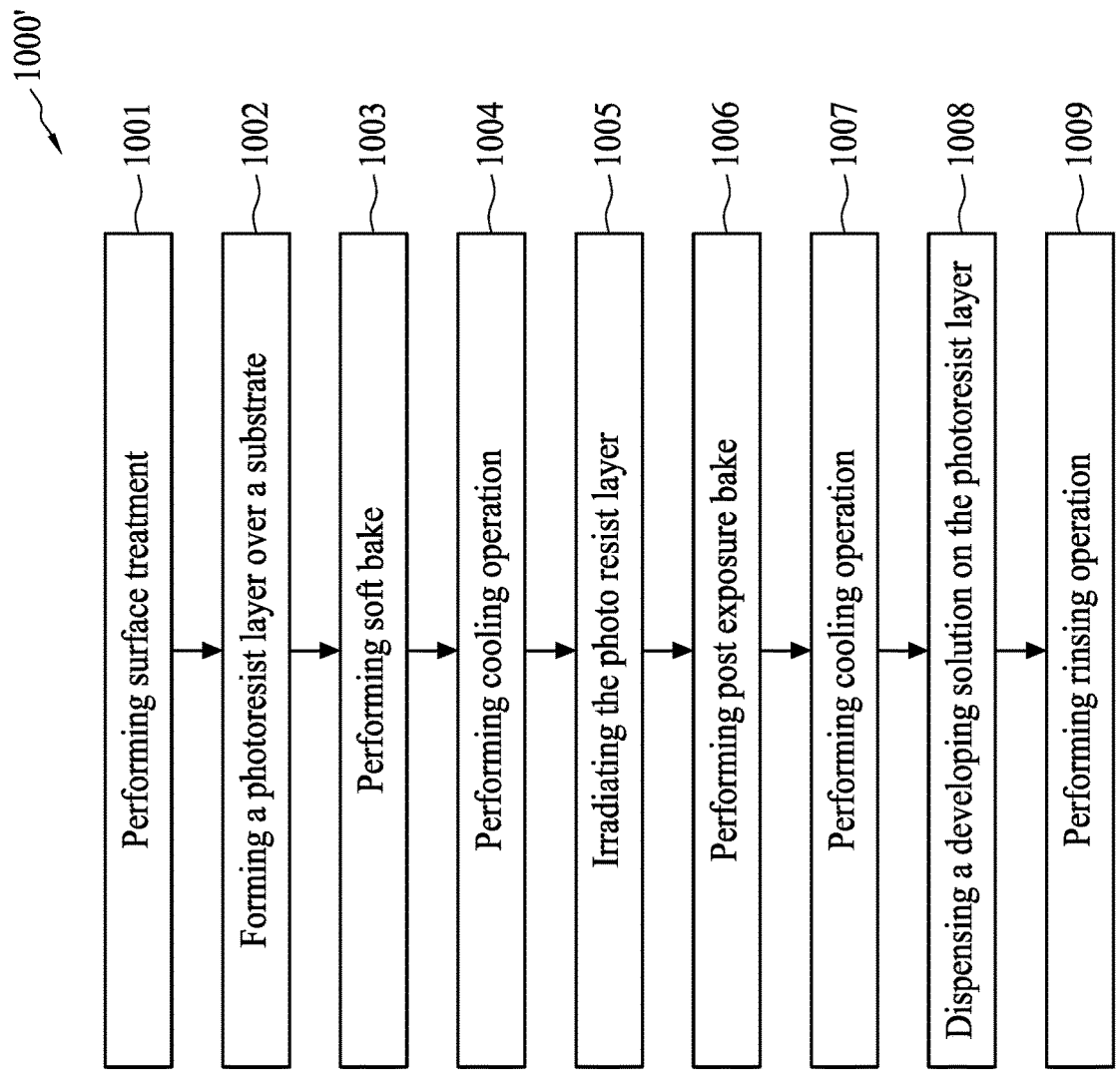
FIG. 2B shows manufacturing operations of a method for fabricating a semiconductor structure, in accordance with some embodiments of the present disclosure.

Referring to FIG. 2A and FIG. 2B, FIG. 2B shows manufacturing operations of a method for fabricating a semiconductor structure, in accordance with some embodiments of the present disclosure. The process flow 1000' for fabricating a semiconductor structure includes operations mentioned in FIG. 2A and may further include performing one or more operations such as surface treatment (operation 1001) on a surface of the wafer prior to operation 1002, soft bake (operation 1003) and cooling operation (operation 1004) between operation 1002 and operation 1005, post exposure bake (operation 1006) and cooling operation (operation 1007) between operation 1005 and operation 1008, and/or rinsing operation (operation 1009) for removing a predetermined portion (may be a developed portion or an undeveloped portion) of the photoresist layer 3 subsequent to operation 1008.

Figure 3:
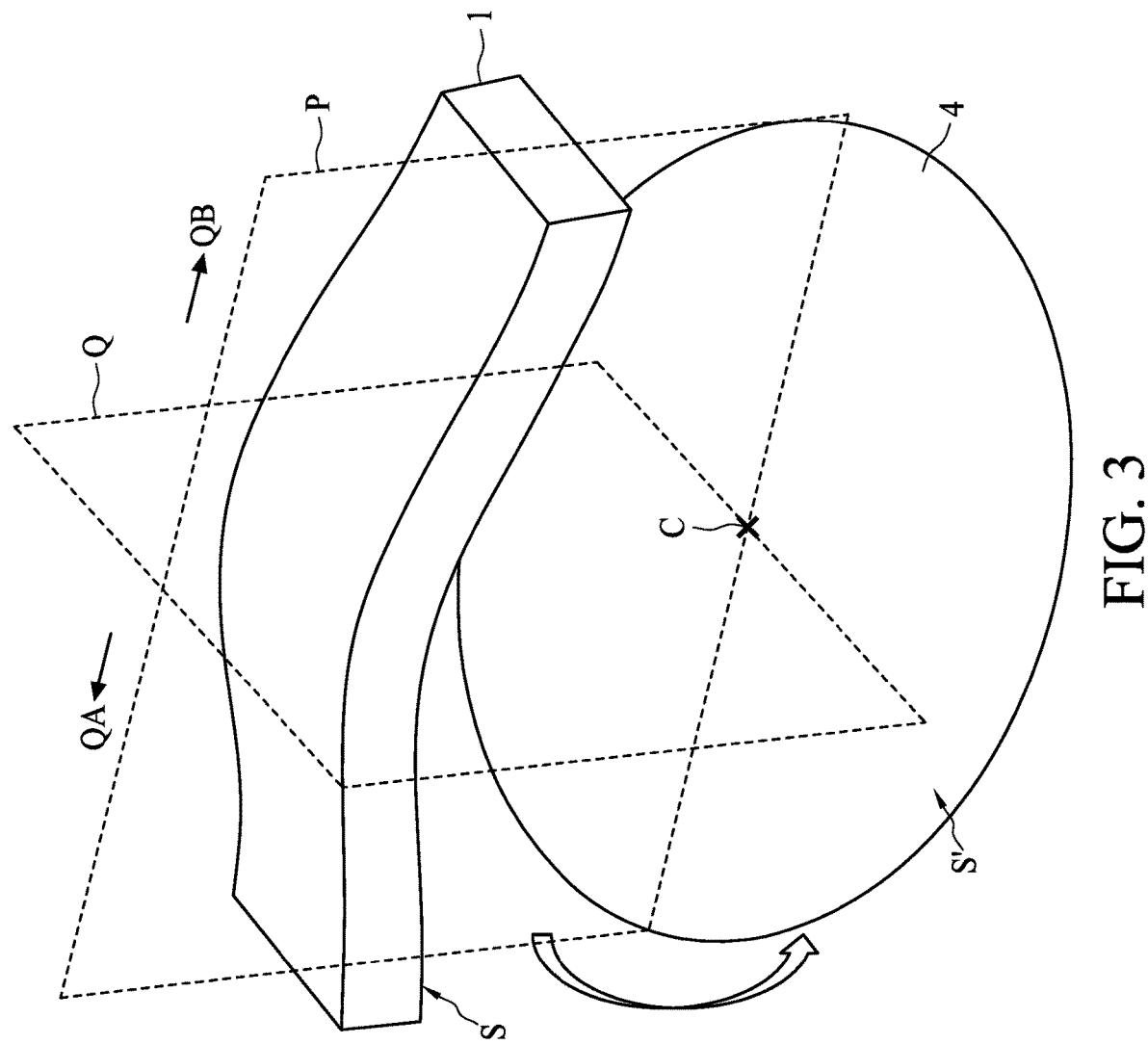
FIG. 3 is a schematic view showing an apparatus for dispensing liquid material, in accordance with some embodiments of the present disclosure.
Figure 4:
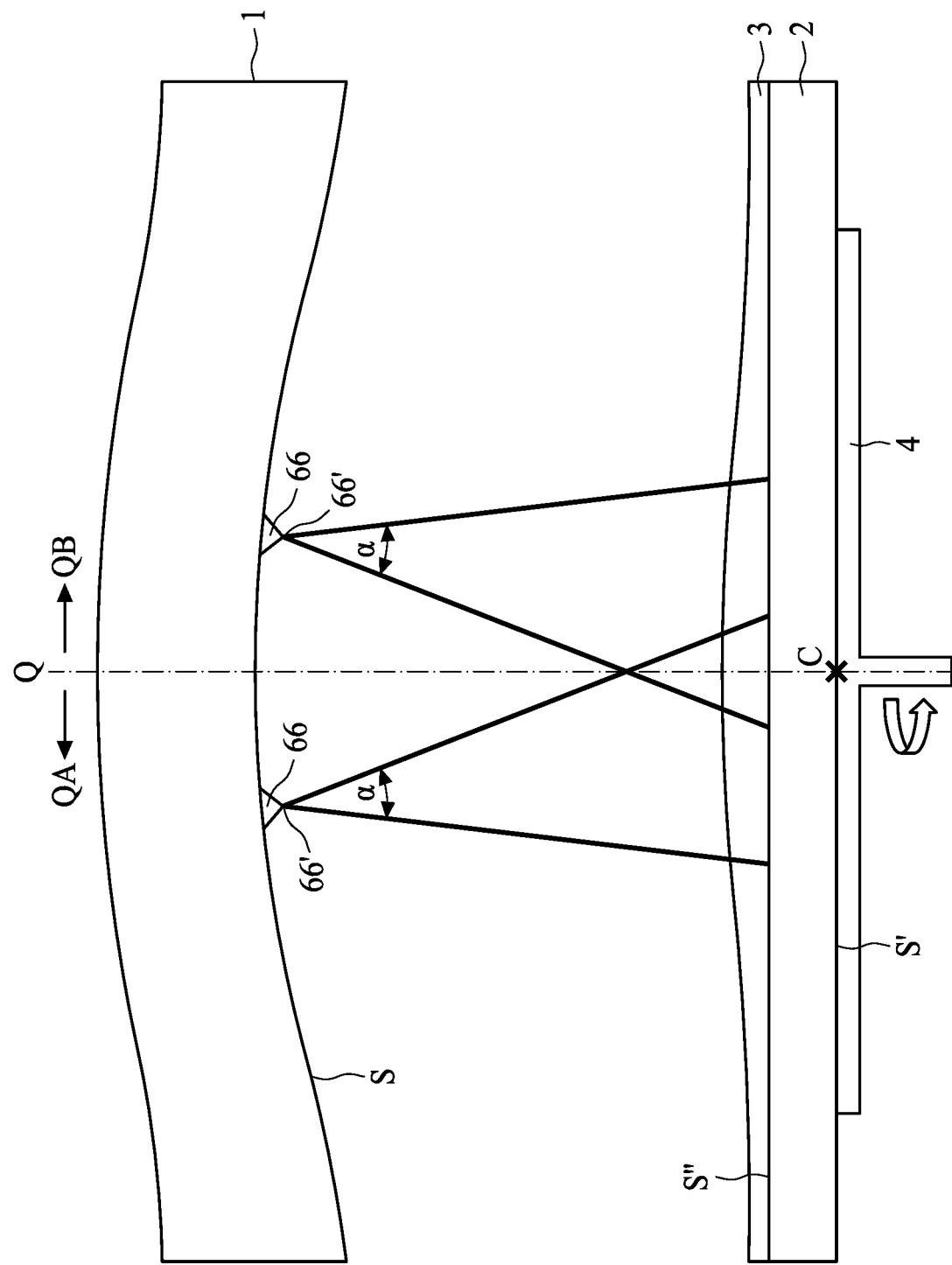
FIG. 4 is a cross sectional view showing an apparatus for dispensing liquid material, in accordance with some embodiments of the present disclosure.

Referring to FIG. 2A, FIG. 3 and FIG. 4, FIG. 3 is a schematic view showing an apparatus for dispensing liquid material, and FIG. 4 is a cross sectional view showing an apparatus for dispensing liquid material, in accordance with some embodiments of the present disclosure. The apparatus for dispensing liquid material includes a dispensing arm 1 and a wafer holder 4 having a top surface S' facing against a bottom surface S of the dispensing arm 1, as the apparatus can be used in operation 1008 for dispensing a developing solution. A wafer 2 is placed on the top surface S' of the wafer holder 4, with a top surface S" of the wafer 2 facing the bottom surface S of the dispensing arm 1. The wafer holder 4 may include a rotational component such as driving motor, so that the wafer holder 4 may rotate the wafer 2 under the dispensing arm 1 at least in operation 1008. A center of the wafer 2 may be on a rotational axis passing through a center C of the top surface S' of the wafer holder 4.

For the purpose of demonstrating the configuration of the dispensing arm 1, a first imaginary plane P and a second imaginary plane Q are illustrated in FIG. 3. The first imaginary plane P and the second imaginary plane Q are vertical to the top surface S' of the wafer holder 4 and intersecting with each other at the center C of the wafer holder 4. The first imaginary plane P is orthogonal to the second imaginary plane Q. A first side QA, and a second side QB of the dispensing arm 1 can thus be defined by virtue of the second imaginary plane Q, that is, the first side QA is opposite to the second side QB while the first side QA and the second side QB are separated by the second imaginary plane Q. In some embodiments, the second imaginary plane Q may be referred to as a center referential plane of the dispensing arm 1.

At least one nozzle 66 is disposed on the bottom surface S of the dispensing arm 1, and each nozzle 66 has an aperture 66' for dispensing developing solution. In some embodiments, the aperture 66' allows each of the nozzle 66 to dispense the liquid material with a substantially identical dispensing angle (α). The bottom surface S of the dispensing arm 1 can be a curved surface, a slant surface, a concaved surface away from the wafer holder 4, or multiple surfaces combined. A dispensing arm 1a subsequently discussed in FIG. 5A to FIG. 5E and a dispensing arm 1b subsequently discussed in FIG. 6A to FIG. 6C are embodiments illustrating some variations of the dispensing arm 1.

Referring to FIG. 5A, FIG. 5A is a schematic drawing illustrating an apparatus for dispensing liquid material, in accordance with some embodiments of the present disclosure. At least a first nozzle 66A is disposed at the bottom surface S of the dispensing arm 1a on the first side QA and optionally, a second nozzle 66B is disposed at the bottom surface S of the dispensing arm 1a on the second side QB. However, the number of nozzle is not limited to the figures illustrated herein. Any suitable number of the nozzle on the dispensing arm 1*a* is within the contemplated scope of present disclosure. In some embodiments, the first nozzle 66A and the second nozzle 66B are disposed on the first imaginary plane P. A first distance DA laterally spaces between the first nozzle 66A and the center C of the wafer holder 4, and a first height HA1 vertically spaces between the first nozzle 66A and the top surface S' of the wafer holder 4. A second distance DB laterally spaces between the second nozzle 66B and the center C of the wafer holder 4, and a second height HB1 vertically spaces between the second nozzle 66B and the top surface S' of the wafer holder 4. In some embodiments, the first distance DA can be different from the second distance DB, and the first height HA1 can be different from the second height HB1. For example, a height vertically spacing between the nozzle and the top surface S" of the wafer 2 is negatively correlated to a distance laterally spacing between the nozzle and the center C of the wafer holder 4, that is, if the first distance DA is greater than the second distance DB, the second height HB1 may be greater than the first height HA1. In some other embodiments, in order to dispense liquid material in a symmetric fashion with regard to the second imaginary plane Q, the first nozzle 66A and the second nozzle 66B may be disposed in a symmetric fashion with regard to the second imaginary plane Q. Alternately stated, the first distance DA can be identical with the second distance DB while the first height HA1 can be identical with the second height HB1.

Figure 5B:
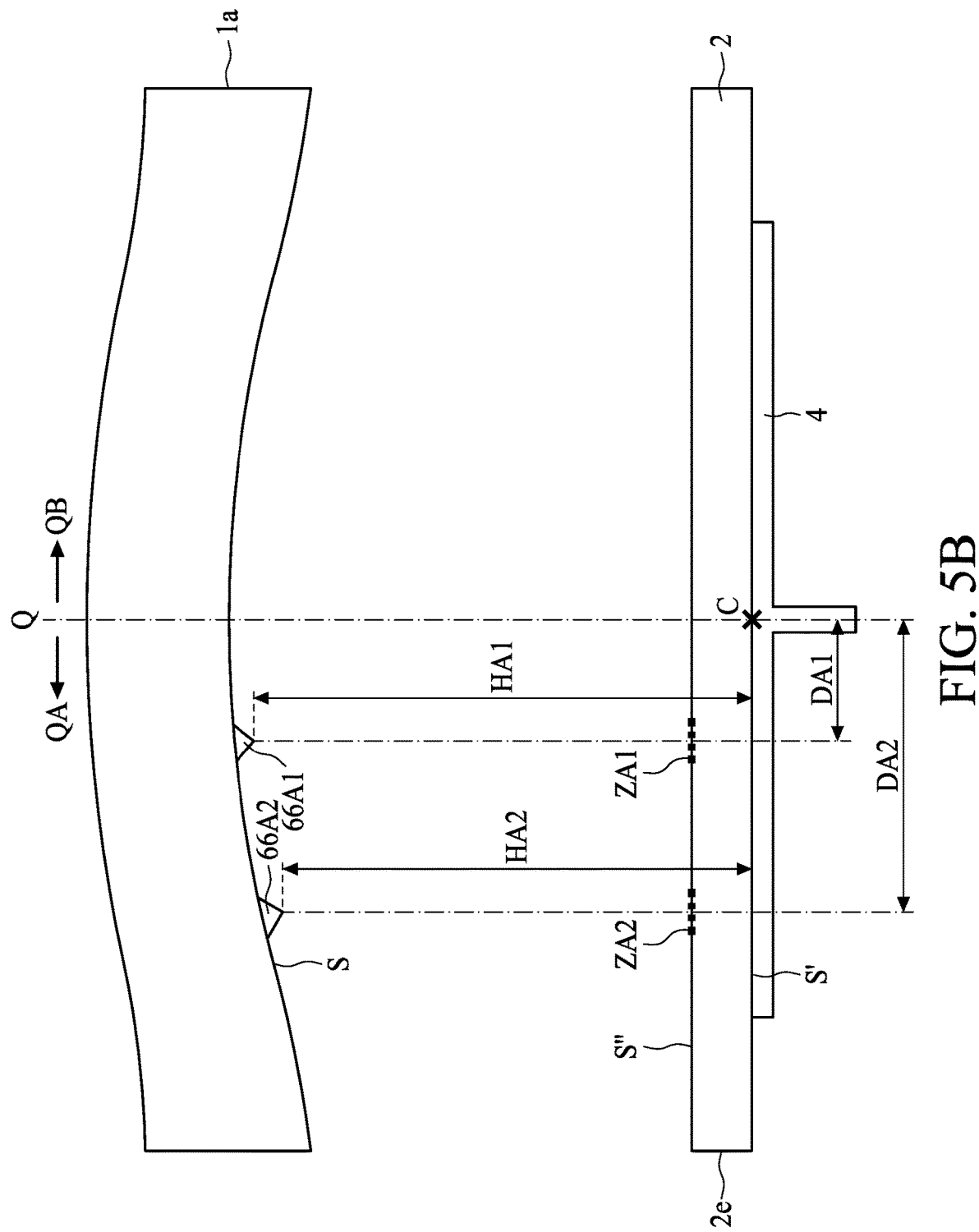
FIG. 5B to FIG. 5C are cross sectional views showing an apparatus for dispensing liquid material, in accordance with some embodiments of the present disclosure.
Figure 5C:
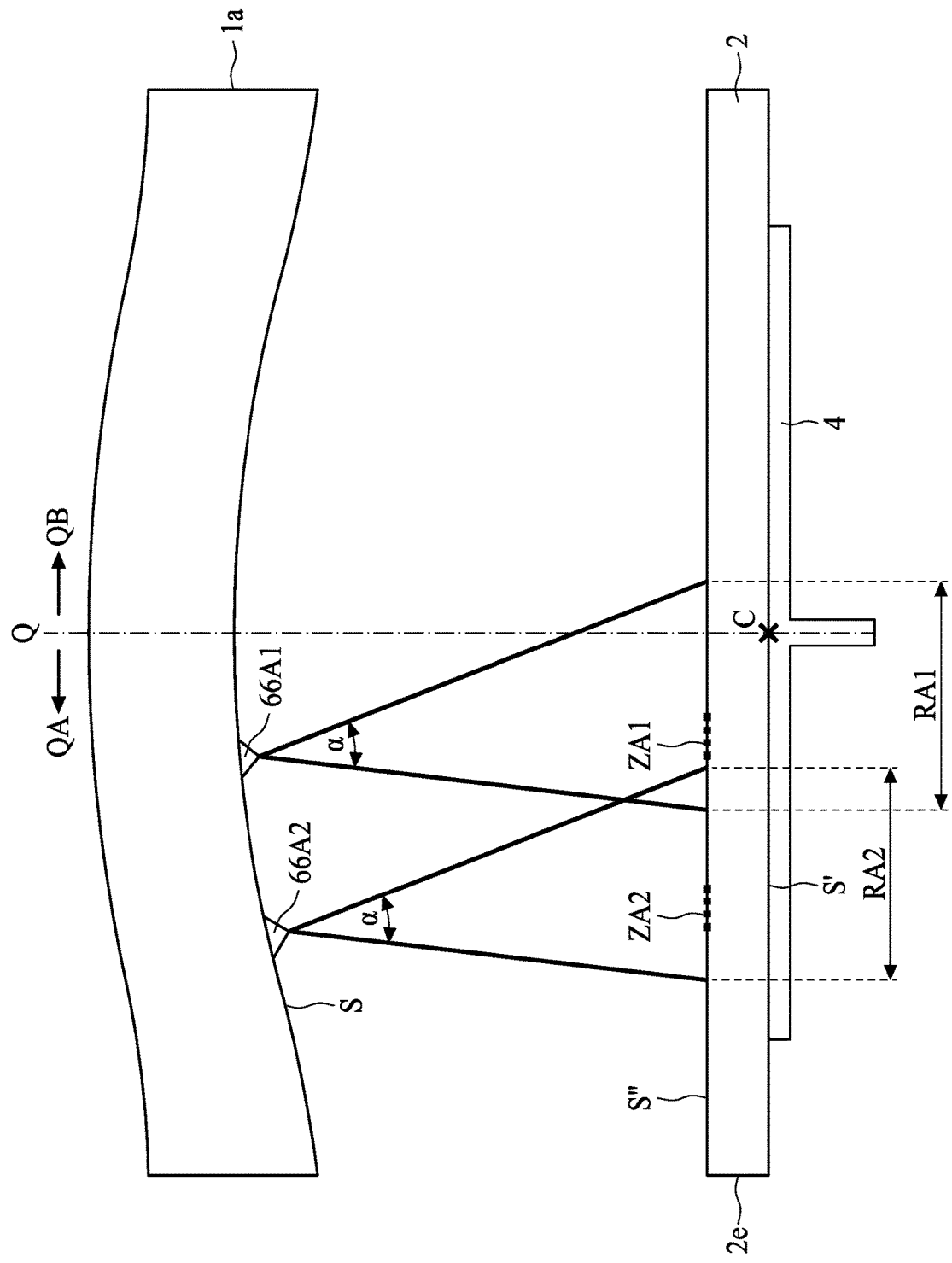
Figure 6B:
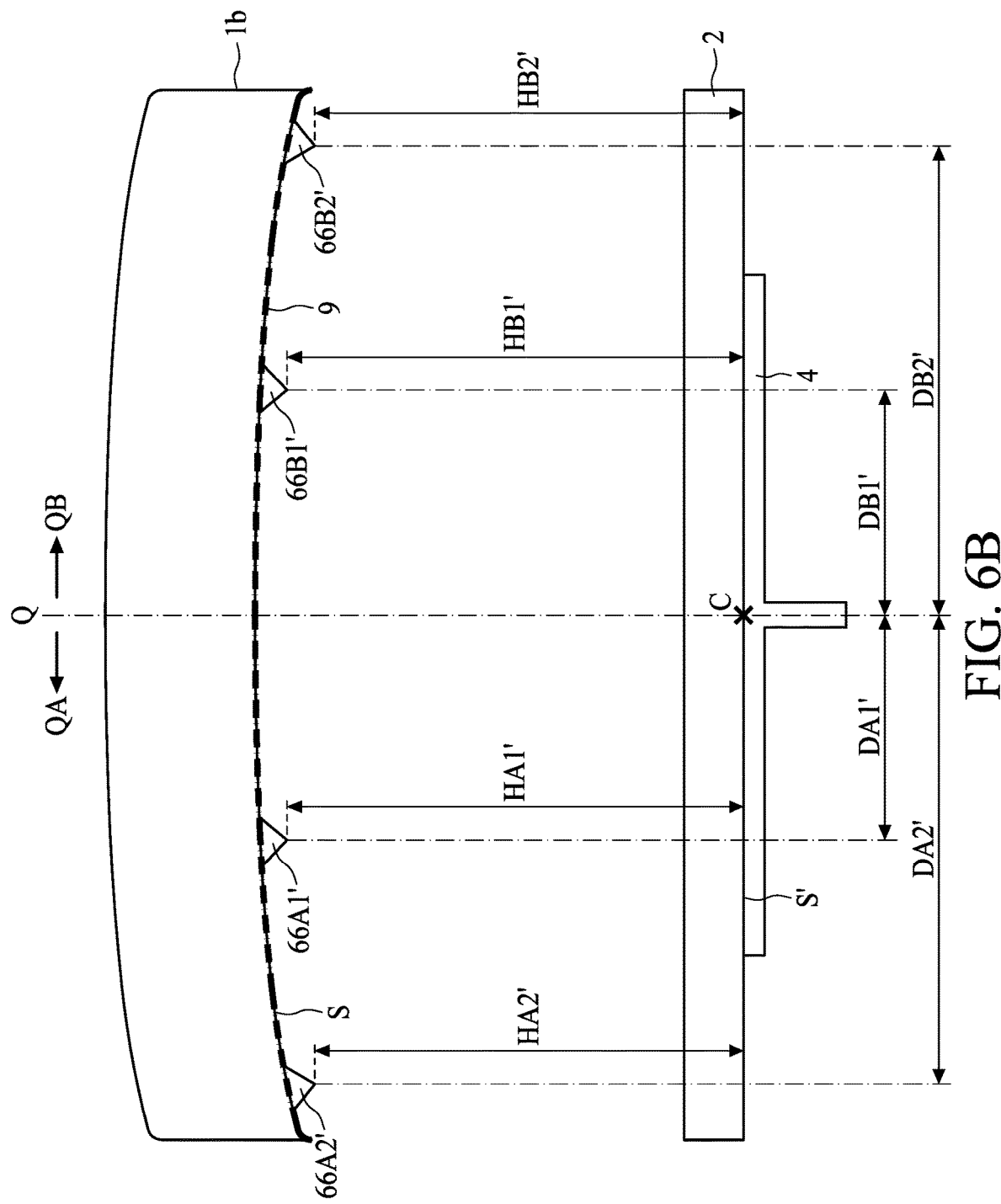
Figure 6C:
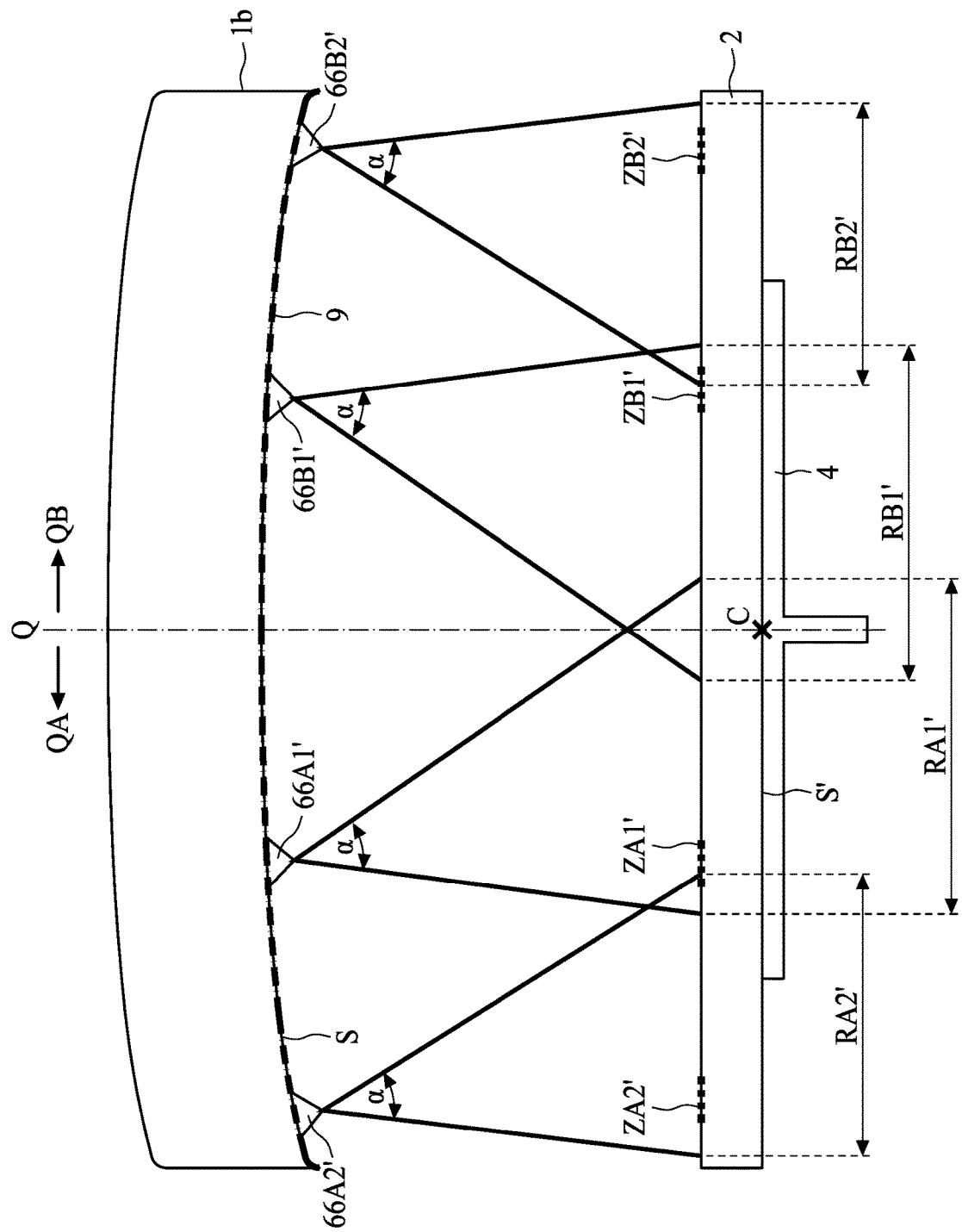

Referring to FIG. 5B and FIG. 5C, FIG. 5B and FIG. 5C are cross sectional views showing an apparatus for dispensing liquid material, in accordance with some embodiments of the present disclosure. A first nozzle 66A1 and optionally, a second nozzle 66A2 are disposed at the bottom surface S of the dispensing arm 1*a* on the first side QA. However, the number of nozzle is not limited to the figures illustrated herein. Any suitable number of the nozzle on the dispensing arm 1*a* is within the contemplated scope of present disclosure. In some embodiments, the first nozzle 66A1 and the second nozzle 66A2 are disposed on the first imaginary plane P. A first distance DA1 laterally spaces between the first nozzle 66A1 and the center C of the wafer holder 4, and a first height HA1 vertically spaces between the first nozzle 66A1 and the top surface S' of the wafer holder 4. A second distance DA2 laterally spaces between the second nozzle 66A2 and the center C of the wafer holder 4, and a second height HA2 vertically spaces between the second nozzle 66A2 and the top surface S' of the wafer holder 4. Herein the second distance DA2 is greater than the first distance DA1 and the first height HA1 is greater than the second height HA2. A second zone ZA2 is a region of the second nozzle 66A2 projected on a top surface S" of the wafer 2 and a first zone ZA1 is a region of the first nozzle 66A1 projected on a top surface S" of the wafer 2. Herein the second zone ZA2 is closer to an edge 2*e* of the wafer 2 than the first zone ZA1.

The first nozzle 66A1 and the second nozzle 66A2 may dispense the liquid material with a substantially identical dispensing angle (α). Inasmuch as the first nozzle 66A1 being further from the top surface S" of the wafer 2 than the second nozzle 66A2, the first nozzle 66A1 may apply the liquid material directly on a first region RA1 of the top surface S" greater than a second region RA2 being directly applied by the liquid material dispensed from second nozzle 66A2. Thereby a coverage window of developing solution within the first region RA1 is greater than a coverage window of developing solution within the second region RA2, thus a develop effect within the first region RA1 is greater than that within the second region RA2. Herein an edge of the second region RA2 distal from the second imaginary plane Q is further from the center of the wafer 2 than an edge of the first region RA1 distal from the second imaginary plane Q, for example the edge of the second region RA2 distal from the second imaginary plane Q has a diameter about 150 mm as the edge of the first region RA1 distal from the second imaginary plane Q has a diameter about 1.00 mm in an operation of developing a wafer having a diameter about 150 mm. In some embodiments, the first zone ZA1 is within the first region RA1 and the second zone ZA2 is within the second region RA2. In such way the non-uniform thickness profile of the photoresist layer 3 (illustrated in FIG. 1 and FIG. 4) can be compensated by the aforesaid configuration of the first nozzle 66A1 and the second nozzle 66A2.

Figure 5D:
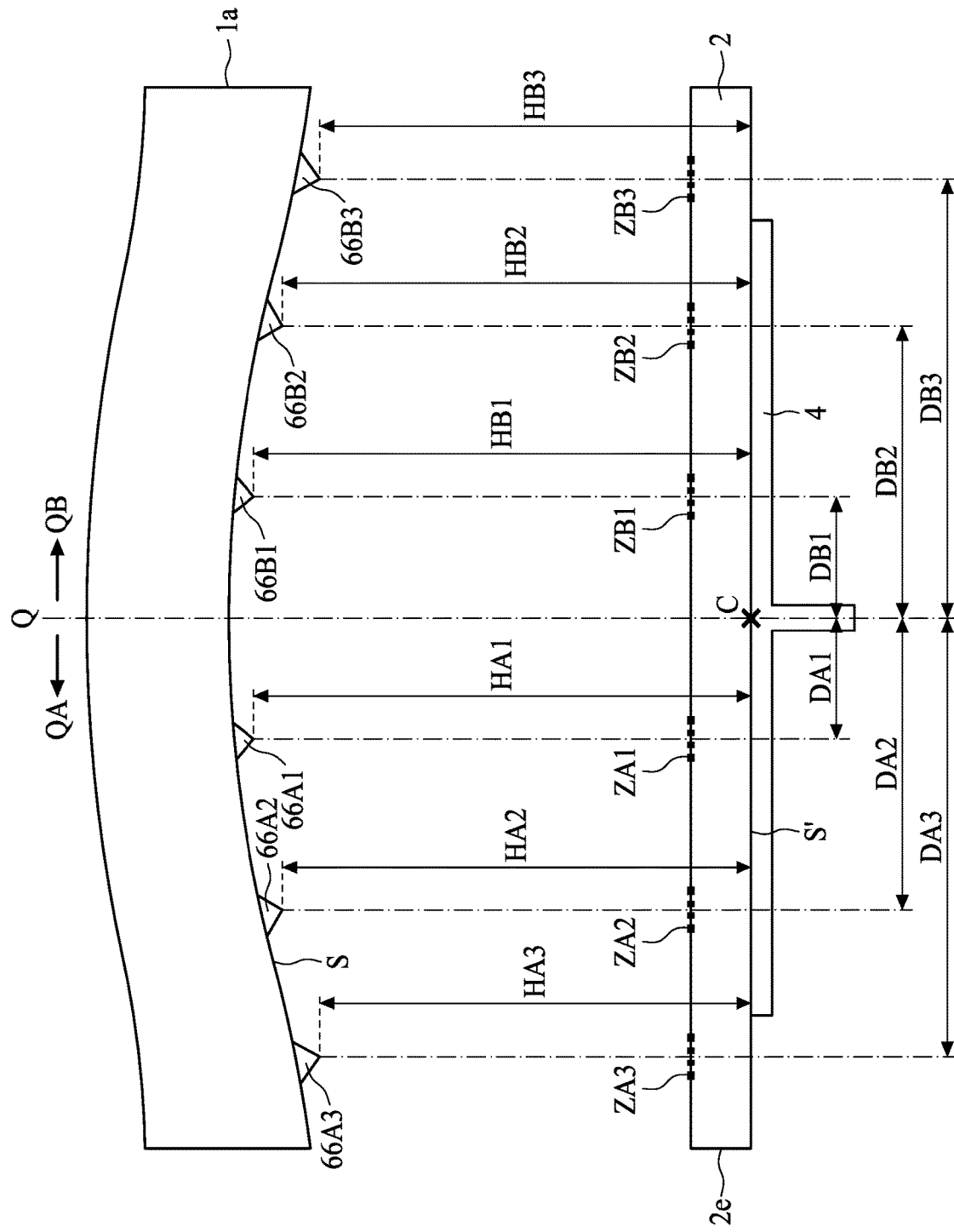
FIG. 5D to FIG. 5E are cross sectional views showing an apparatus for dispensing liquid material, in accordance with some embodiments of the present disclosure.
Figure 5E:
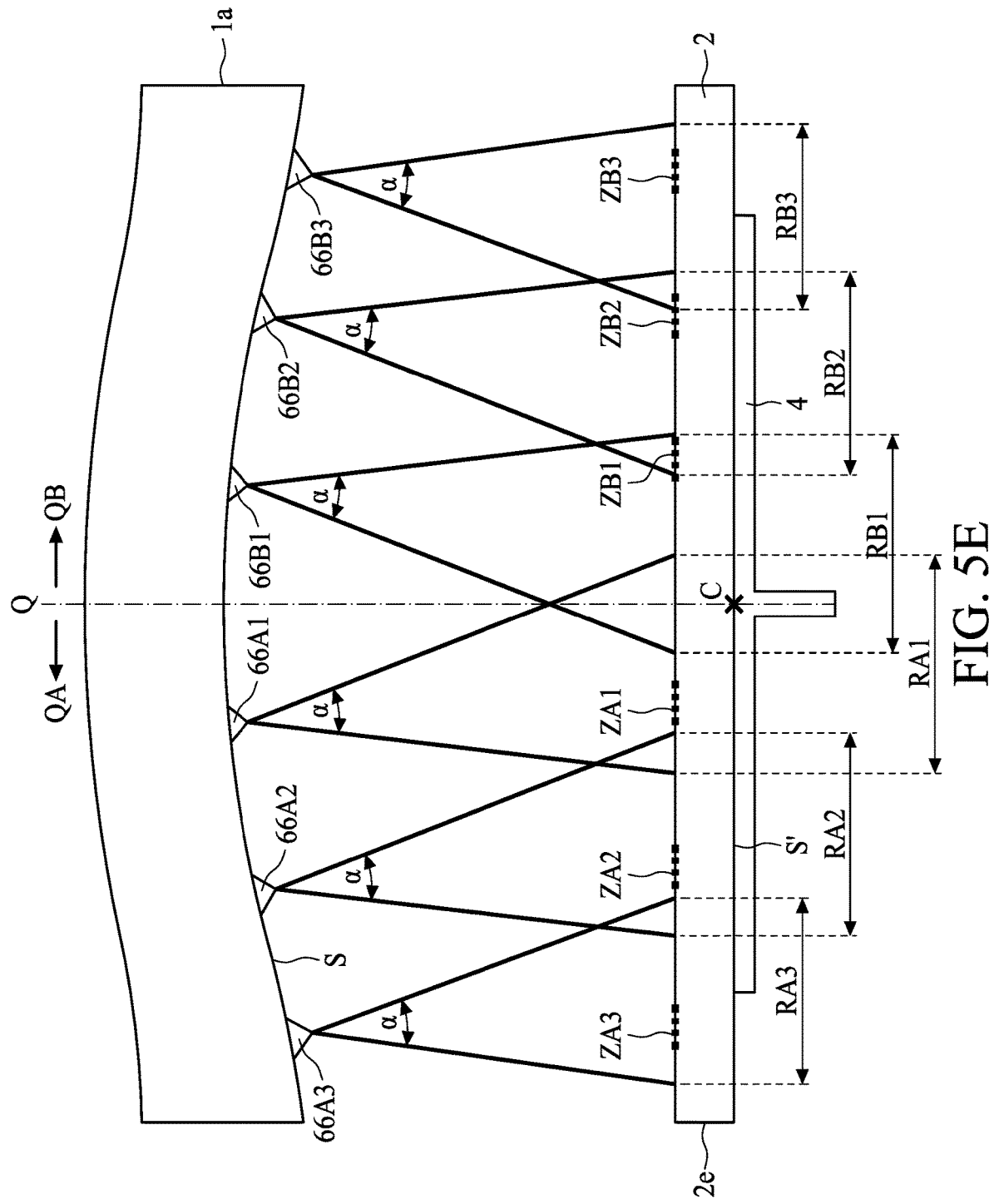

Referring to FIG. 5D and FIG. 5E, FIG. 5D and FIG. 5E are cross sectional views showing an apparatus for dispensing liquid material, in accordance with some embodiments of the present disclosure. In some embodiments, at least two nozzles may be disposed at the bottom surface S of the dispensing arm 1*a* in order to enhance the efficiency of developing and to compensate the non-uniform thickness profile of the photoresist layer 3 (illustrated in FIG. 1 and FIG. 4) with improved control of accuracy. For the purpose of conciseness, FIG. 5D and FIG. 5E illustrates embodiments of the dispensing arm 1*a* having six nozzles disposed at the bottom surface S thereto, each denoted as a first nozzle 66A1, a second nozzle 66A2, a third nozzle 66A3, a fourth nozzle 66B1, a fifth nozzle 66B2, and a sixth nozzle 66B3, but it is noteworthy that the numbers of nozzles are not limited in the present disclosure. Those skilled in the art may be able to apply similar configuration to a dispensing arm having at least two nozzles.

In some embodiments, at least one of the aforesaid nozzles are disposed on the first side QA of the dispensing arm 1*a* and at least one of the nozzles are disposed on the second side QB of the dispensing arm 1*a*. For example, the first nozzle 66A1, the second nozzle 66A2, and the third nozzle 66A3 are disposed on the first side QA as the fourth nozzle 66B1, the fifth nozzle 66B2, and the sixth nozzle 66B3 are disposed on the second side QB.

A first distance DA1 laterally spaces between the first nozzle 66A1 and the center C of the wafer holder 4, and a first height HA1 vertically spaces between the first nozzle 66A1 and the top surface S' of the wafer holder 4. A second distance DA2 laterally spaces between the second nozzle 66A2 and the center C of the wafer holder 4, and a second height HA2 vertically spaces between the second nozzle 66A2 and the top surface S' of the wafer holder 4. Herein the second distance DA2 is greater than the first distance DA1 and the first height HA1 is greater than the second height HA2. A third distance DA3 laterally spaces between the third nozzle 66A3 and the center C of the wafer holder 4, and a third height HA3 vertically spaces between the third nozzle 66A3 and the top surface S' of the wafer holder 4. Herein the third distance DA3 is greater than the second distance DA2; while the second height HA2 is greater than the third height HA3.

A fourth distance DB1 laterally spaces between the fourth nozzle 66B1 and the center C of the wafer holder 4, and a fourth height HB1 vertically spaces between the fourth nozzle 66B1 and the top surface S' of the wafer holder 4. A fifth distance DB2 laterally spaces between the fifth nozzle 66B2 and the center C of the wafer holder 4, and a fifth height HB2 vertically spaces between the fifth nozzle 66B2 and the top surface S' of the wafer holder 4. Herein the fifth distance DB2 is greater than the fourth distance DB1 and the fourth height HB1 is greater than the fifth height HB2. A sixth distance DB3 laterally spaces between the sixth nozzle 66B3 and the center C of the wafer holder 4, and a sixth height HB3 vertically spaces between the sixth nozzle 66B3 and the top surface S' of the wafer holder 4. Herein the sixth distance DB3 is greater than the fifth distance DB2 and the fifth height HB2 is greater than the sixth height HB3.

In some embodiments, in order to dispense liquid material in a symmetric fashion with regard to the second imaginary plane Q to control the development rate more accurately, the first nozzle 66A1, the second nozzle 66A2, the third nozzle 66A3, the fourth nozzle 66B1, the fifth nozzle 66B2, and the sixth nozzle 66B3 may also be disposed along the first imaginary plane P in a symmetric fashion with regard to the second imaginary plane Q. Alternately stated, the first distance DA1 can be identical with the fourth distance DB1, the second distance DA2 can be identical with the fifth distance DB2, and the third distance DA3 can be identical with the sixth distance DB3. The first height HA1 can be identical with the fourth height HB1, the second height HA2 can be identical with the fifth height HB2, and the third height HA3 can be identical with the sixth height HB3.

The first nozzle 66A1 to the sixth nozzle 66B3 may dispense the liquid material with a substantially identical dispensing angle (α). An area of a region being applied by the dispensed liquid material is positively correlated to a height between the nozzle and the top surface S" of the wafer 2, while the height vertically spacing between the nozzle and the top surface S" of the wafer 2 is negatively correlated to a distance laterally spacing between the nozzle and the center C of the wafer holder 4. Therefore, the first nozzle 66A1 may directly apply the liquid material on a first region RA1 of the top surface S" greater than a second region RA2 being directly applied by the liquid material dispensed from the second nozzle 66A2, and the second region RA2 is greater than the third region RA3 being directly applied by the liquid material dispensed from the third nozzle 66A3. The relationships between the fourth nozzle 66B1, the fifth nozzle 66B2, and the sixth nozzle 66B3 are similar thereto. The fourth nozzle 66B1 may directly apply the liquid material on a fourth region RB1 of the top surface S" greater than a fifth region RB2 being directly applied by the liquid material dispensed from the fifth nozzle 66B2, and the fifth region RB2 is greater than the sixth region RB3 being directly applied by the liquid material dispensed from the sixth nozzle 66B3. Herein an edge of the third region RA3 distal from the second imaginary plane Q is further from the center of the wafer 2 than an edge of the second region RA2 distal from the second imaginary plane Q, and the edge of the second region RA2 distal from the second imaginary plane Q is further from the center of the wafer 2 than an edge of the first region RA1 distal from the second imaginary plane Q. For example the edge of the third region RA3 distal from the second imaginary plane Q has a diameter about 150 mm, the edge of the second region RA2 distal from the second imaginary plane Q has a diameter about 100 mm, as the edge of the first region RA1 distal from the second imaginary plane Q has a diameter about 50 mm in an operation of developing a wafer having a diameter about 150 mm.

An edge of the sixth region RB3 distal from the second imaginary plane Q is further from the center of the wafer 2 than an edge of the fifth region RB2 distal from the second imaginary plane Q, and the edge of the fifth region RB2 distal from the second imaginary plane Q is further from the center of the wafer 2 than an edge of the fourth region RB1 distal from the second imaginary plane Q. In some embodiments, the fourth region RB1, the fifth region RB2, and the sixth region RB3 may be symmetric with the first region RA1, the second region RA2, and the third region RA3 respectively.

A first zone ZA1 is a region of the first nozzle 66A1 projected on a top surface S" of the wafer 2, a second zone ZA2 is a region of the second nozzle 66A1 projected on the top surface S" of the wafer 2, and a third zone ZA3 is a region of the third nozzle 66A3 projected on the top surface S" of the wafer 2. Similarly, a fourth zone ZB1 is a region of the fourth nozzle 66B1 projected on a top surface S" of the wafer 2, a fifth zone ZB2 is a region of the fifth nozzle 66B1 projected on the top surface S" of the wafer 2, and a sixth zone ZB3 is a region of the sixth nozzle 66B3 projected on the top surface S" of the wafer 2. In some embodiments, the first zone ZA1, the second zone ZA2, the third zone ZA3, the fourth zone ZB1, the fifth zone ZB2, the sixth zone ZB3 are within the first region RA1, the second region RA2, the third region RA3, the fourth region RB1, the fifth region RB2, and the sixth region RB3 respectively.

Thereby a coverage window of developing the top surface S" proximal to the center of the wafer 2 is greater than a coverage window of developing the top surface S" proximal to the edge 2e of the wafer 2, thus a develop effect proximal to the center of the wafer 2 is greater than that proximal to the edge 2e of the wafer 2. In such way the non-uniform thickness profile of the photoresist layer 3 (illustrated in FIG. 1 and FIG. 4) can be compensated by the aforesaid configuration illustrated in FIG. 5D and FIG. 5E.

Referring to FIG. 6A, FIG. 6A is a cross sectional view showing an apparatus for dispensing liquid material, in accordance with some embodiments of the present disclosure. At least a first nozzle 66 on a bottom surface S of the dispensing arm 1b, herein the bottom surface S includes a curved surface 9 concave away from the wafer holder 4, and the curved surface 9 has a first end E1 and a second end E2 opposite to the first end E1. The first end E1 is passed by a first tangent line TL1 and the second end E2 is passed by a second tangent line TL2, wherein an acute and inclusive angle θ between the first tangent line TL1 and the second tangent line TL2 is greater than 0. In some embodiments, the bottom surface S may further include flat extension portion in the peripheral area, but the flat extension portion may not be deemed as a part of the curved surface 9 thus the exterior ends of such flat extension portion may not be deemed as the first end E1 and a second end E2. The nozzle 66 may dispense the liquid material with a dispensing angle (α).

Referring to FIG. 6B and FIG. 6C, FIG. 6B and FIG. 6C are cross sectional views showing an apparatus for dispensing liquid material, in accordance with some embodiments of the present disclosure. In some embodiments, a plurality of nozzles 66 may be disposed at the bottom surface S of the dispensing arm 1a in order to enhance the efficiency of developing and to compensate the non-uniform thickness profile of the photoresist layer 3 (illustrated in FIG. 1 and FIG. 4) with improved control of accuracy. For the purpose of conciseness, FIG. 6B and FIG. 6C illustrates embodiments of the dispensing arm 1b having four nozzles 66 disposed at the curved surface 9. Each nozzles are denoted as a first nozzle 66A1', a second nozzle 66A2', a third nozzle 66B1', and a fourth nozzle 66B2', but it is noteworthy that the numbers of nozzles 66 are not limited in the present disclosure. Those skilled in the art may be able to apply similar configuration to a dispensing arm having at least two nozzles.

In some embodiments, at least one of the aforesaid nozzles is disposed at the bottom surface S of the dispensing arm 1*b*. For example, the first nozzle 66A1' and the second nozzle 66A2' are disposed on the first side QA as the third nozzle 66B1' and the fourth nozzle 66B2' are disposed on the second side QB.

A first distance DA1' laterally spaces between the first nozzle 66A1' and the center C of the wafer holder 4, and a first height HA1' vertically spaces between the first nozzle 66A1' and the top surface S' of the wafer holder 4. A second distance DA2' laterally spaces between the second nozzle 66A2' and the center C of the wafer holder 4, and a second height HA2' vertically spaces between the second nozzle 66A2' and the top surface S' of the wafer holder 4. Herein the second distance DA2' is greater than the first distance DA1' and the first height HA1' is greater than the second height HA2'.

A third distance DB1' laterally spaces between the third nozzle 66B1' and the center C of the wafer holder 4, and a third height HB1' vertically spaces between the third nozzle 66B1' and the top surface S' of the wafer holder 4. A fourth distance DB2' laterally spaces between the fourth nozzle 66B2' and the center C of the wafer holder 4, and a fourth height HB2' vertically spaces between the fourth nozzle 66B2' and the top surface S' of the wafer holder 4. Herein the fourth distance DB2' is greater than the third distance DB1' and the third height HB1' is greater than the fourth height HB2'.

In some embodiments, in order to dispense liquid material in a symmetric fashion with regard to the second imaginary plane Q to control the development rate more accurately, the first nozzle 66A1', the second nozzle 66A2', the third nozzle 66B1', and the fourth nozzle 66B2' may be disposed on the first imaginary plane P in a symmetric fashion with regard to the second imaginary plane Q. Alternately stated, the first distance DA1' can be identical with the third distance DB1', and the second distance DA2' can be identical with the fourth distance DB2'. The first height HA1' can be identical with the third height HB1', and the second height HA2' can be identical with the fourth height HB2'.

The first nozzle 66A1', the second nozzle 66A2', the third nozzle 66B1', and the fourth nozzle 66B2' may dispense the liquid material with a substantially identical dispensing angle ($\alpha$). An area of a region being applied by the dispensed liquid material is positively correlated to a height between the nozzle and the top surface S" of the wafer 2, while the height vertically spacing between the nozzle and the top surface S" of the wafer 2 is negatively correlated to a distance laterally spacing between the nozzle and the center C of the wafer holder 4. Therefore, the first nozzle 66A1' may directly apply the liquid material on a first region RA1' of the top surface S" greater than a second region RA2' being directly applied by the liquid material dispensed from the second nozzle 66A2'. The third nozzle 66B1' may directly apply the liquid material on a third region RB1' of the top surface S" greater than a fourth region RB2' being directly applied by the liquid material dispensed from the fourth nozzle 66B2'. Herein an edge of the second region RA2' distal from the second imaginary plane Q is further from the center of the wafer 2 than an edge of the first region RA1' distal from the second imaginary plane Q. An edge of the fourth region RB2' distal from the second imaginary plane Q is further from the center of the wafer 2 than an edge of the third region RB1' distal from the second imaginary plane Q. For example the edge of the second region RA2' distal from the second imaginary plane Q has a diameter about 150 mm, the edge of the first region RA1' distal from the second imaginary plane Q has a diameter about 100 mm in an operation of developing a wafer having a diameter about 150 mm. In some embodiments, the third region RB1', and the fourth region RB2' may be symmetric with the first region RA1', and the second region RA2' respectively.

A first zone ZA1' is a region of the first nozzle 66A1' projected on a top surface S" of the wafer 2, a second zone ZA2' is a region of the second nozzle 66A2' projected on the top surface S" of the wafer 2, and a third zone ZB1' is a region of the third nozzle 66B1' projected on the top surface S" of the wafer 2, and a fourth zone ZB2 is a region of the fourth nozzle 66B2' projected on a top surface S" of the wafer 2. In some embodiments, the first zone ZA1', the second zone ZA2', the third zone ZB1', and the fourth zone ZB2' are within the first region RA1', the second region RA2', the third region RB1', and the fourth region RB2' respectively.

Thereby a coverage window of developing the top surface S" proximal to the center of the wafer 2 is greater than a coverage window of developing the top surface S" proximal to the edge 2*e* of the wafer 2, thus a develop effect proximal to the center of the wafer 2 is greater than that proximal to the edge 2*e* of the wafer 2. In such way the non-uniform thickness profile of the photoresist layer 3 (illustrated in FIG. 1 and FIG. 4) can be compensated by the aforesaid configuration illustrated in FIG. 6B and FIG. 6C.

Referring to FIG. 2B and FIG. 7A to FIG. 7C, FIG. 7A to FIG. 7C are cross sectional views showing an apparatus for dispensing liquid material, in accordance with some embodiments of the present disclosure. An area of a region being applied by the dispensed liquid material is positively correlated to a height between the nozzle and the top surface S" of the wafer 2. Therefore, in some embodiments, the apparatus may further include a tunable mechanism 77 to adjust a vertical distance between a nozzle and the top surface of the wafer 2 so that the dispensed area can also be adjusted. The tunable mechanism 77 can be applied to the dispensing arm 1, including the dispensing arm 1*a* or the dispensing arm 1*b* previously discussed in FIG. 5A to FIG. 6C. The tunable mechanism 77 may include driving screw, positioning screw, linkage, pivot, fastener, or the like, as the adjustment of the tunable mechanism 77 can be performed automatically or manually. In some embodiments, the tunable mechanism 77 can be a plurality of gadgets positioned to individually adjust each of the nozzels 66 on the surface S of the dispensing arm 1*a*/1*b*. It should be appreciated by people having ordinary skill in the art that as long as a height profile of the nozzels, including HA1, HA2, HA3, HB1, HB2, HB3, etc., previously addressed can be achieved by auto or manual tuning, the surface S of the dispensing arm 1*a*/1*b* may not have to be curved, concaved, or slanted. In some embodiments, the surface S of the dispensing arm 1*a*/1*b* is flat with individually tunable nozzles, wherein details can be referred to FIG. 7D.

In order to improve the accuracy of the dispensing distribution, the dispensing arm 1 is adjusted based on a thickness profile of a photoresist layer 3 (shown in FIG. 4) formed on the wafer 2. Therefore a thickness profile of the photoresist layer 3 is measured prior to adjusting the dispensing arm 1 so that the adjustment can be performed in accordance with the thickness profile of the photoresist layer 3. Herein the measurement can be performed subsequent to forming the photoresist layer over a substrate (operation 1002) or subsequent to irradiating the photoresist layer (operation 1005). In some embodiments, in order to obtain a more precise thickness profile of a photoresist layer 3, the thickness profile is measured subsequent to a cooling operation (operation 1004) preceded by soft bake (operation 1003) or a cooling operation (operation 1007) preceded by post exposure bake (operation 1006) inasmuch as the thickness profile of the photoresist layer 3 may be changed due to elevated temperature as dispensing a developing solution on the photoresist layer (operation 1008) may be performed under a temperature lower than a temperature entailed in baking.

Figure 7A:
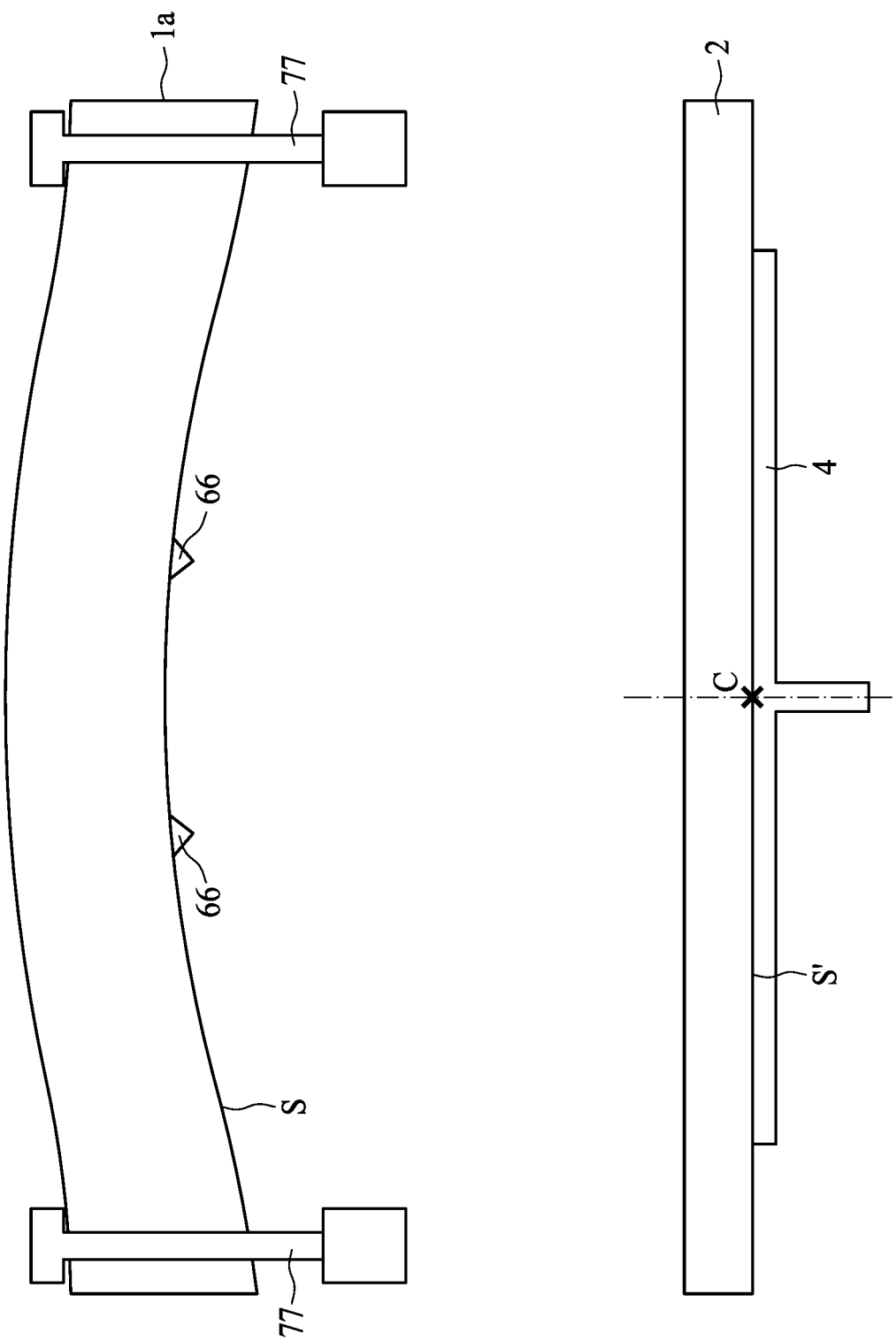
FIG. 7A to FIG. 7D are cross sectional views showing an apparatus for dispensing liquid material, in accordance with some embodiments of the present disclosure.

Referring to FIG. 7A, herein the dispensing arm 1*a* discussed in FIG. 5A to FIG. 5E is used as a exemplary demonstration. The tunable mechanism 77 is connected to the dispensing arm 1*a* so that a height vertically spacing between each of the nozzle 66 and the top surface S" of the wafer 2 as well as a correlation between the height thereof and a distance laterally spacing between the nozzle 66 and the center C of the wafer holder 4 is adjusted.

Figure 7B:
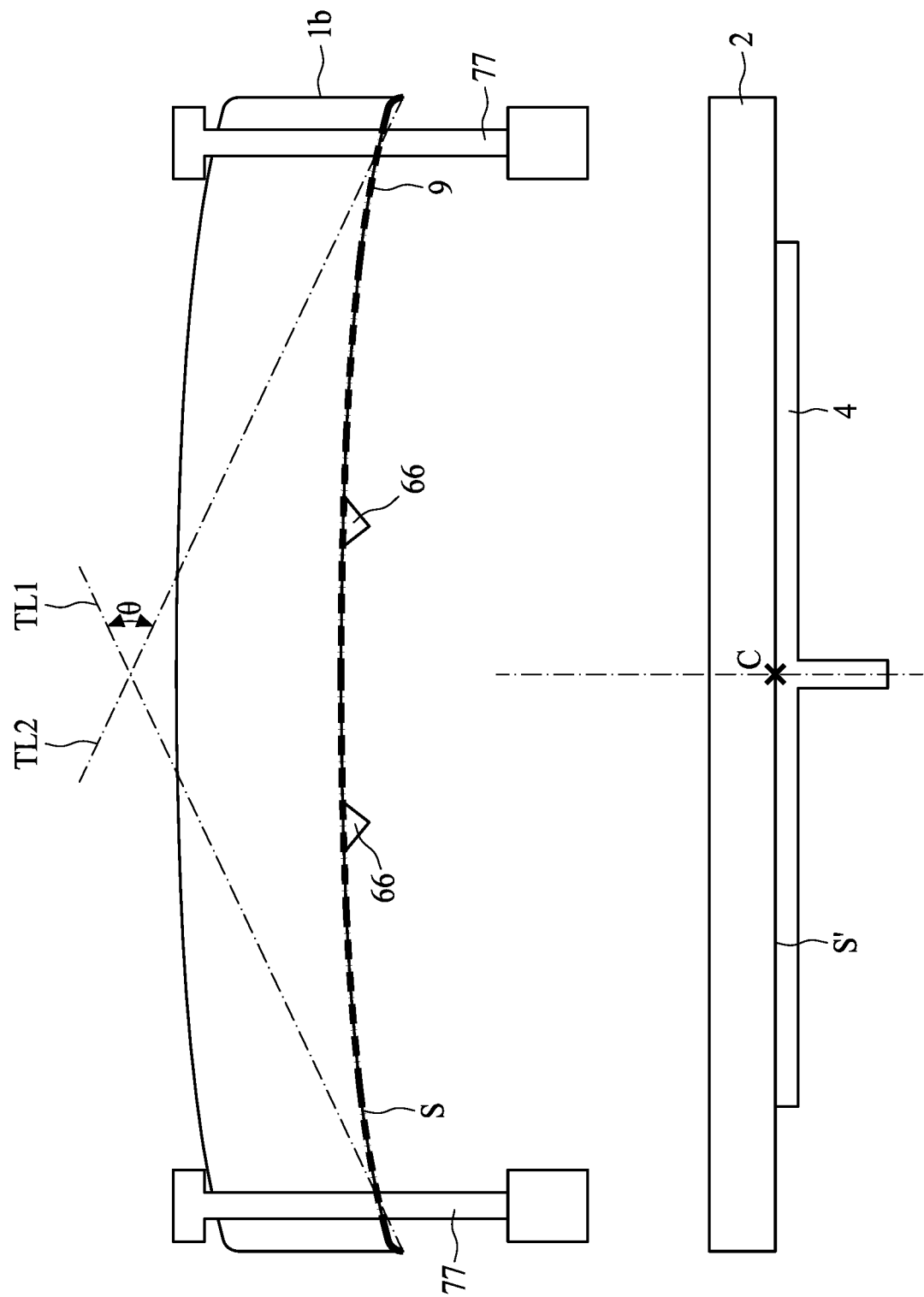

Referring to FIG. 7B, herein the dispensing arm 1*b* discussed in FIG. 6A to FIG. 6C is used as a demonstrative example. The tunable mechanism 77 is connected to the dispensing arm 1*b* so that a curvature of the curved surface 9 or the inclusive angle θ between the first tangent line TL1 and the second tangent line TL2 can be tuned. Thereby a height vertically spacing between each of the nozzle 66 and the top surface S" of the wafer 2 as well as a correlation between the height thereof and a distance laterally spacing between the nozzle 66 and the center C of the wafer holder 4 is adjusted.

Figure 7C:
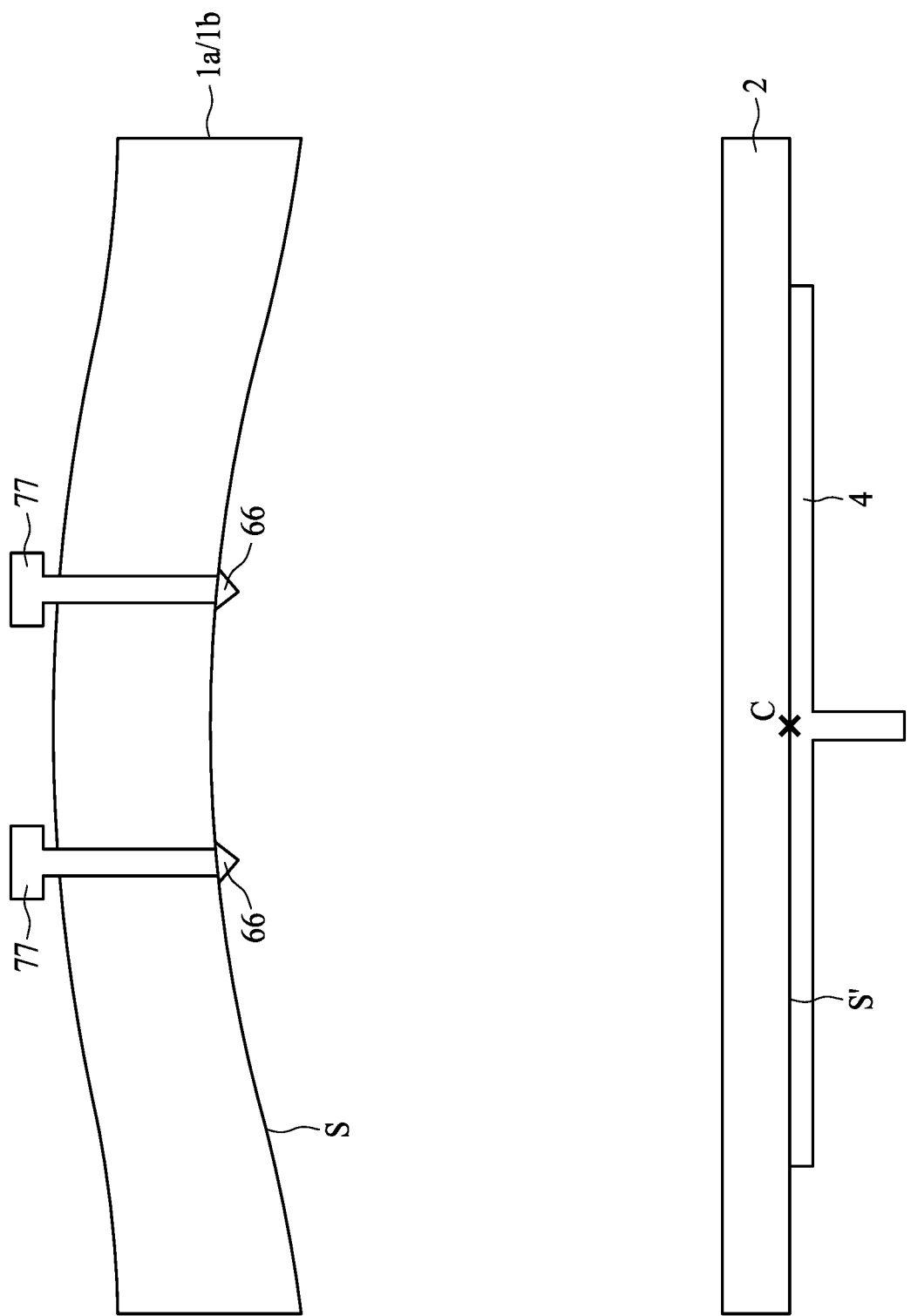
Figure 7D:
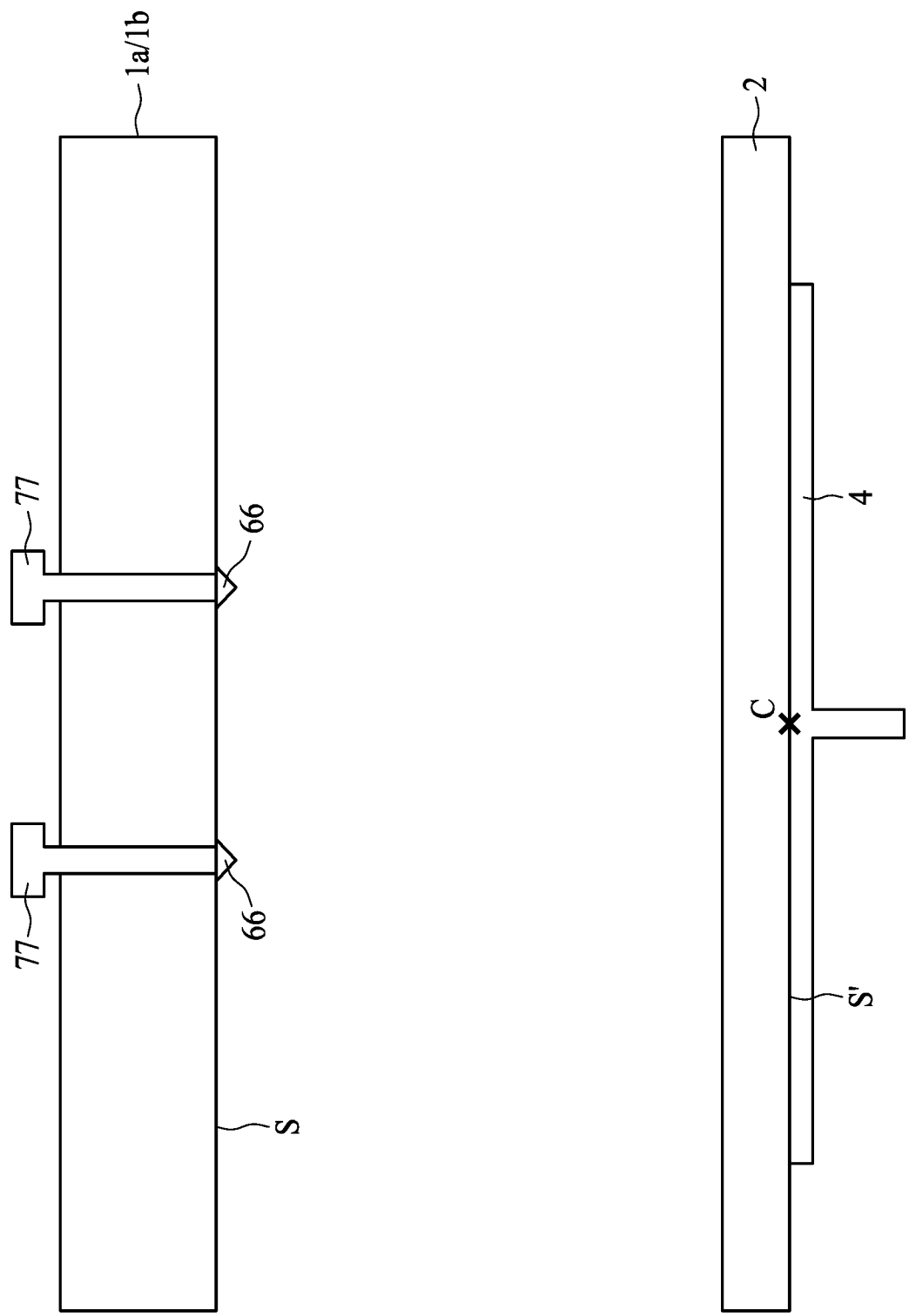

Referring to FIG. 7C, the tunable mechanism 77 is connected to the nozzle 66 so that a height vertically spacing between each of the nozzle 66 and the top surface S" of the wafer 2 is adjusted. Thereby a correlation between the height thereof and a distance laterally spacing between the nozzle 66 and the center C of the wafer holder 4 is adjusted. Referring to FIG. 7D, FIG. 7D is a cross sectional view showing an apparatus for dispensing liquid material, in accordance with some embodiments of the present disclosure. The surface S of the dispensing arm 1*a*/1*b* is flat with individually tunable nozzles may be separately adjusted by the the tunable mechanism 77. Thereby a correlation between the height thereof and a distance laterally spacing between the nozzle 66 and the center C of the wafer holder 4 is adjusted.

Some embodiments of the present disclosure provide an apparatus for dispensing liquid material and a method for fabricating a semiconductor device. Since a thickness profile of the photoresist layer 3 formed on a wafer 2 may be non-uniform inasmuch as a high viscosity photoresist material may not be uniformly dispersed over the wafer 2 under spin coating, thereby having a greater thickness around a center portion. In order to compensate such non-uniform thickness profile of the photoresist layer 3, the developing solution is dispensed in a fashion that a nozzle laterally closer to the center C of the wafer holder 4 dispense the developing solution to cover a greater region comparing to a nozzle laterally further from the center C of the wafer holder 4, thereby a coverage window of developing the top surface S" proximal to the center of the wafer 2 is greater than a coverage window of developing the top surface S" proximal to the edge 2*e* of the wafer 2, a develop effect proximal to the center of the wafer 2 is greater than that proximal to the edge 2*e* of the wafer 2.

Some embodiments of the present disclosure may further provide the tunable mechanism 77 to tune the dispensing arm 1. A thickness profile of the photoresist layer 3 formed on a wafer 2 can be measured so that the dispensing arm 1 thus can be adjusted in accordance with the thickness profile thereof. In such way the accuracy of developing a non-uniform photoresist layer 3 may be improved.

Some embodiments of the present disclosure provide an apparatus for dispensing liquid material, including a dispensing arm, a wafer holder under the dispensing arm, a first nozzle on the dispensing arm, a first distance laterally spacing the first nozzle and a center of the wafer holder, and a first height vertically spacing between the first nozzle and a surface of the wafer holder, and a second nozzle on the dispensing arm, a second distance laterally spacing the second nozzle and the center of the wafer holder, and a second height vertically spacing between the second nozzle and the surface of the wafer holder, wherein the second distance is greater than the first distance, and the first height is greater than the second height.

Some embodiments of the present disclosure provide an apparatus for dispensing a developing solution, including a dispensing arm having a surface facing a wafer holder, the surface comprising a first tangent line passing one end of the surface, and a second tangent line passing an opposite end of the surface, an inclusive angle between the first tangent line and the second tangent line being greater than zero, and a first nozzle disposed at the surface.

Some embodiments of the present disclosure provide a method for fabricating a semiconductor structure, including forming a photoresist layer over a substrate, irradiating the photoresist layer, and dispensing a developing solution on the photoresist layer by the apparatus to form a resist pattern, wherein the apparatus comprises a dispensing arm, a wafer holder under the dispensing arm, a first nozzle on the dispensing arm, a first distance laterally spacing the first nozzle and a center of the wafer holder, and a first height vertically spacing between the first nozzle and a surface of the wafer holder, and a second nozzle on the dispensing arm, a second distance laterally spacing the second nozzle and the center of the wafer holder, and a second height vertically spacing between the second nozzle and the surface of the wafer holder, wherein the second distance is greater than the first distance, and the first height is greater than the second height.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus for dispensing liquid material, comprising:
   a wafer holder;
   a dispensing arm over the wafer holder, wherein the dispensing arm has a surface facing the wafer holder, the surface is concaved away from the wafer holder, a first vertical distance is between the wafer holder and a first portion of the surface;
   a first nozzle disposed at a second portion of the surface free from overlapping with the first portion, wherein a second vertical distance is between the first nozzle and the wafer holder; and
   a tunable mechanism for adjusting a difference between the first vertical distance and the second vertical distance.

2. The apparatus of claim 1, further comprising a second nozzle disposed at the surface.

3. The apparatus of claim 1, wherein the tunable mechanism comprises a screw.

4. The apparatus of claim 1, wherein the tunable mechanism comprises a fastener.

5. The apparatus of claim 1, wherein the tunable mechanism is disposed at an edge of the dispensing arm.

6. The apparatus of claim 1, wherein the tunable mechanism penetrates the dispensing arm.

7. The apparatus of claim 1, wherein the wafer holder is rotatable.

8. The apparatus of claim 1, wherein the tunable mechanism is engaging with the dispensing arm.

9. The apparatus of claim 1, wherein the tunable mechanism comprises two fasteners disposed on opposite sides of the dispensing arm.

10. An apparatus for dispensing a solution, comprising:
    a wafer holder;
    a dispensing arm over the wafer holder, wherein the dispensing arm has a surface facing the wafer holder;
    a first nozzle disposed at the surface;
    a second nozzle disposed at the surface; and
    means for individually adjusting a first distance between the first nozzle and the wafer holder and a second distance between the second nozzle and the wafer holder.

11. The apparatus of claim 10, wherein the surface is concaved away from the wafer holder.

12. The apparatus of claim 10, wherein the surface is flat.

13. The apparatus of claim 10, wherein the means for individually adjusting the first distance and the second distance comprises a screw or a fastener.

14. The apparatus of claim 10, wherein the first nozzle comprises an aperture for allowing solution to pass through.

15. A method for fabricating a semiconductor structure, comprising:
    forming a photoresist layer over a substrate;
    irradiating the photoresist layer;
    dispensing a developing solution on the photoresist layer through a first nozzle and a second nozzle on a dispensing arm, wherein the first nozzle and the second nozzle are disposed on a surface of the dispensing arm; and
    adjusting a first position of the first nozzle and a second position of the second nozzle by adjusting a curvature of the surface.

16. The method of claim 15, wherein adjusting the first position and the second position comprises adjusting a vertical distance between the first position and the substrate.

17. The method of claim 15, wherein adjusting the first position and the second position comprises individually adjusting the first position and the second position.

18. The method of claim 15, further comprising rinsing the substrate subsequent to dispensing the developing solution.

19. The method of claim 15, wherein adjusting the first position and the second position is performed manually or automatically.

20. The method of claim 15, wherein adjusting the first position and the second position is performed prior to dispensing the solution.

* * * * *